United States Patent
Kim et al.

(10) Patent No.: US 8,465,992 B2
(45) Date of Patent: Jun. 18, 2013

(54) METHOD OF MANUFACTURING FLEXIBLE DISPLAY DEVICE

(75) Inventors: Seung-Hun Kim, Yongin (KR); Hoon-Kee Min, Yongin (KR); Dong-Un Jin, Yongin (KR); Sang-Joon Seo, Yongin (KR); Sung-Guk An, Yongin (KR); Young-Gu Kim, Yongin (KR); Hyung-Sik Kim, Yongin (KR); Young-Ji Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 78 days.

(21) Appl. No.: 13/200,398

(22) Filed: Sep. 23, 2011

(65) Prior Publication Data

US 2012/0100647 A1    Apr. 26, 2012

(30) Foreign Application Priority Data

Oct. 22, 2010    (KR) .................. 10-2010-0103675

(51) Int. Cl.
*H01L 21/84*    (2006.01)

(52) U.S. Cl.
USPC ...... 438/26; 438/977; 438/455; 257/E33.059; 257/E21.502; 257/E21.7

(58) Field of Classification Search
USPC ............... 438/26, 126, 458, 977; 257/E21.7, 257/E21.502, E33.059
See application file for complete search history.

(56) References Cited

U.S. PATENT DOCUMENTS

| | | | |
|---|---|---|---|
| 7,045,442 B2 * | 5/2006 | Maruyama et al. | 438/458 |
| 7,245,331 B2 * | 7/2007 | Yamazaki et al. | 349/45 |
| 7,335,573 B2 * | 2/2008 | Takayama et al. | 438/455 |
| 7,494,066 B2 * | 2/2009 | Koyama et al. | 235/492 |
| 7,611,965 B2 * | 11/2009 | Suzuki et al. | 438/458 |
| 7,652,292 B2 * | 1/2010 | Takechi | 257/72 |
| 7,696,063 B2 * | 4/2010 | Tsuchiya | 438/455 |
| 7,712,676 B2 * | 5/2010 | Yukawa et al. | 235/492 |
| 7,714,950 B2 * | 5/2010 | Yamazaki et al. | 349/45 |
| 7,723,209 B2 * | 5/2010 | Maruyama et al. | 438/458 |
| 7,727,809 B2 * | 6/2010 | Ito et al. | 438/110 |
| 7,745,252 B2 * | 6/2010 | Suzuki et al. | 438/82 |
| 7,879,687 B2 * | 2/2011 | Yamada | 438/455 |

(Continued)

FOREIGN PATENT DOCUMENTS

| | | |
|---|---|---|
| JP | 2004-014513 | 1/2004 |
| KR | 10-2005-0064883 | 6/2005 |

(Continued)

*Primary Examiner* — Mary Wilczewski
(74) *Attorney, Agent, or Firm* — Robert E. Bushnell, Esq.

(57) ABSTRACT

A method of manufacturing a flexible display device is provided. The method includes: preparing a first flexible substrate on which a display unit is formed; forming an encapsulation unit including a base substrate, a second flexible substrate formed on the base substrate, and a barrier layer formed on the second flexible substrate; combining the encapsulation unit with the display unit; and separating the base substrate from the second flexible substrate by using a difference between a coefficient of thermal expansion of the base substrate and a coefficient of thermal expansion of the second flexible substrate, by applying a heated solution between the base substrate and the second flexible substrate. The flexible display device is easily manufactured since the base substrate and the second flexible substrate, which have different coefficients of thermal expansion and are coupled to each other, are separable from each other by applying the heated solution.

20 Claims, 10 Drawing Sheets

U.S. PATENT DOCUMENTS

| | | | |
|---|---|---|---|
| 7,942,338 B2* | 5/2011 | Koyama et al. | 235/492 |
| 8,168,511 B2* | 5/2012 | Nishiki et al. | 438/458 |
| 8,228,454 B2* | 7/2012 | Yamazaki et al. | 349/45 |
| 8,284,369 B2* | 10/2012 | Chida et al. | 349/149 |
| 8,289,164 B2* | 10/2012 | Yamazaki et al. | 340/572.1 |
| 8,313,035 B2* | 11/2012 | Koyama et al. | 235/492 |
| 2003/0221614 A1 | 12/2003 | Kang et al. | |
| 2004/0029317 A1* | 2/2004 | Tokushige | 438/118 |
| 2005/0057717 A1* | 3/2005 | Rho | 349/158 |
| 2006/0055314 A1* | 3/2006 | Nakamura et al. | 313/500 |
| 2007/0045621 A1* | 3/2007 | Suzuki et al. | 257/40 |
| 2007/0048970 A1* | 3/2007 | Suzuki et al. | 438/455 |
| 2010/0075447 A1 | 3/2010 | Lee et al. | |
| 2010/0295683 A1* | 11/2010 | Yamazaki et al. | 340/572.7 |
| 2011/0114952 A1* | 5/2011 | Yamada | 257/52 |
| 2011/0114993 A1* | 5/2011 | Lee et al. | 257/100 |
| 2011/0147747 A1* | 6/2011 | Jeon et al. | 257/59 |
| 2011/0204361 A1* | 8/2011 | Nishiki et al. | 257/52 |
| 2011/0221272 A1* | 9/2011 | Koyama et al. | 307/42 |
| 2012/0001181 A1* | 1/2012 | Aoki et al. | 257/57 |
| 2012/0100647 A1* | 4/2012 | Kim et al. | 438/28 |
| 2012/0126234 A1* | 5/2012 | Yamazaki et al. | 257/59 |
| 2012/0273834 A1* | 11/2012 | Hatano et al. | 257/99 |

FOREIGN PATENT DOCUMENTS

| | | |
|---|---|---|
| KR | 10-2005-0113478 | 12/2005 |
| KR | 10-2007-0081556 | 8/2007 |
| KR | 10-2008-0065210 | 7/2008 |
| KR | 10-2008-0073941 | 8/2008 |

\* cited by examiner

METHOD OF MANUFACTURING FLEXIBLE DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 22 Oct. 2010 and there duly assigned Ser. No. 10-2010-0103675.

BACKGROUND OF THE INVENTION

1. Field of the Invention

The present invention relates to a display device, and more particularly, to a method of manufacturing a flexible display device, wherein a base substrate of an encapsulation unit is easily separated from a flexible substrate.

2. Description of the Related Art

An organic light emitting display device including a thin film transistor (TFT) is drawing attention as a mobile display device, such as a digital camera, a video camera, a camcorder, a personal digital assistant (PDA), or a smart phone.

Recently, a flexible display device that is easy to carry and applicable to devices having various shapes is being studied. Here, a flexible display device using an organic light emitting display technology is most influential.

Since a lifespan of an organic material used in an organic light emitting display of the flexible display device using the organic light emitting display technology may remarkably decrease when the organic material is exposed to oxygen or moisture, the flexible display device needs to be completely encapsulated.

SUMMARY OF THE INVENTION

The present invention provides a method of manufacturing a flexible display device, wherein an encapsulation process is easily performed by using a difference between a coefficient of thermal expansion of a base substrate of an encapsulation unit and a coefficient of thermal expansion of a flexible substrate during separation of the base substrate.

According to an aspect of the present invention, there is provided a method of manufacturing a flexible display device, the method including: preparing a first flexible substrate on which a display unit is formed; forming an encapsulation unit comprising a base substrate, a second flexible substrate formed on the base substrate, and a barrier layer formed on the second flexible substrate; combining the encapsulation unit with the display unit; and separating the base substrate from the second flexible substrate by using a difference between a coefficient of thermal expansion of the base substrate and a coefficient of thermal expansion of the second flexible substrate, by applying a heated solution between the base substrate and the second flexible substrate.

In the forming of the encapsulation unit, the base substrate may be a film substrate having a first coefficient of thermal expansion, and the second flexible substrate may be a flexible film substrate having a second coefficient of thermal expansion higher than the first coefficient of thermal expansion. The second flexible substrate is thinner than the base substrate.

The base substrate may include glass.

The second flexible substrate may include any one of polycarbonate (PC), polyethersulphone (PES), polyethylene terephthalate (PET), polyethylenenaphthalate (PEN), polyimide (PI), polyarylate (PAR), and fiber glass reinforced plastic (FRP).

The second flexible substrate may be formed by coating a polymer material for forming the second flexible substrate on the base substrate.

In the separating of the base substrate from the second flexible substrate, the solution may include water having a temperature higher than room temperature.

The base substrate may be separated from the second flexible substrate by dipping the combined first flexible substrate and encapsulation unit in the heated solution.

The base substrate may be separated from the second flexible substrate by spraying a portion between the base substrate and the second flexible substrate with the heated solution.

According to another aspect of the present invention, there is provided a method of manufacturing a flexible display device, the method including: forming a first barrier layer on a first flexible substrate; forming a thin film transistor on the first barrier layer; forming a display unit electrically connected to the thin film transistor, on the thin film transistor; forming an encapsulation unit comprising a base substrate, a second flexible substrate formed on the base substrate, and a second barrier layer formed on the second flexible substrate; combining the encapsulation unit with the display unit; and separating the base substrate from the second flexible substrate by using a difference between a coefficient of thermal expansion of the base substrate and a coefficient of thermal expansion of the second flexible substrate, by applying a heated solution between the base substrate and the second flexible substrate.

In the forming of the encapsulation unit, the encapsulation layer may be manufactured separately from the display unit, and combined to the display unit.

The base substrate may be a film substrate having a first coefficient of thermal expansion, and the second flexible substrate may be a flexible film substrate having a second coefficient of thermal expansion higher than the first coefficient of thermal expansion. The second flexible substrate may be thinner than the base substrate.

The second flexible substrate may be formed by coating a polymer material for forming the second flexible substrate on the base substrate.

The method may further include forming an additional base substrate for supporting the first flexible substrate, below the first flexible substrate.

The additional base substrate may be formed of the same material as the base substrate of the encapsulation unit, and the first flexible substrate may be formed of the same material as the second flexible substrate.

The additional base substrate may be separated from the first flexible substrate by dipping the additional base substrate in the heated solution or spraying a portion between the additional base substrate and the first flexible substrate with the heated solution.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 3 through 11 are cross-sectional views for sequentially describing a method of manufacturing a flexible display device, according to an embodiment of the present invention, wherein:

FIG. 3 is a cross-sectional view of a base substrate, a flexible substrate, and a first barrier layer, which are sequentially stacked;

FIG. 4 is a cross-sectional view of a semiconductor layer, a gate insulation layer, a gate electrode, an interlayer insulation layer, a contact hole, a source electrode and a drain electrode, and a protection layer, which are sequentially stacked on the first barrier layer of FIG. 3;

FIG. 5 is a cross-sectional view of a first electrode connected to one of the source electrode and the drain electrode of FIG. 4;

FIG. 6 is a cross-sectional view of a pixel definition layer formed on the first electrode of FIG. 5;

FIG. 7 is a cross-sectional view of an organic light emitting diode manufactured by forming a second electrode on the first electrode of FIG. 6;

FIG. 8 is a cross-sectional view of an encapsulation unit to be encapsulated on the organic light emitting diode of FIG. 7;

FIG. 9 is a cross-sectional view of the encapsulation unit of FIG. 8 coupled to the organic light emitting diode;

FIG. 10 is a cross-sectional view for describing separation of a first base substrate and a second base substrate of FIG. 9; and FIG. 11 is a cross-sectional view of the flexible display device after the first base substrate and the second base substrate are separated from the flexible display device;

DETAILED DESCRIPTION OF THE INVENTION

Hereinafter, the present invention will be described more fully with reference to the accompanying drawings, in which exemplary embodiments of the invention are shown.

Figure 1:
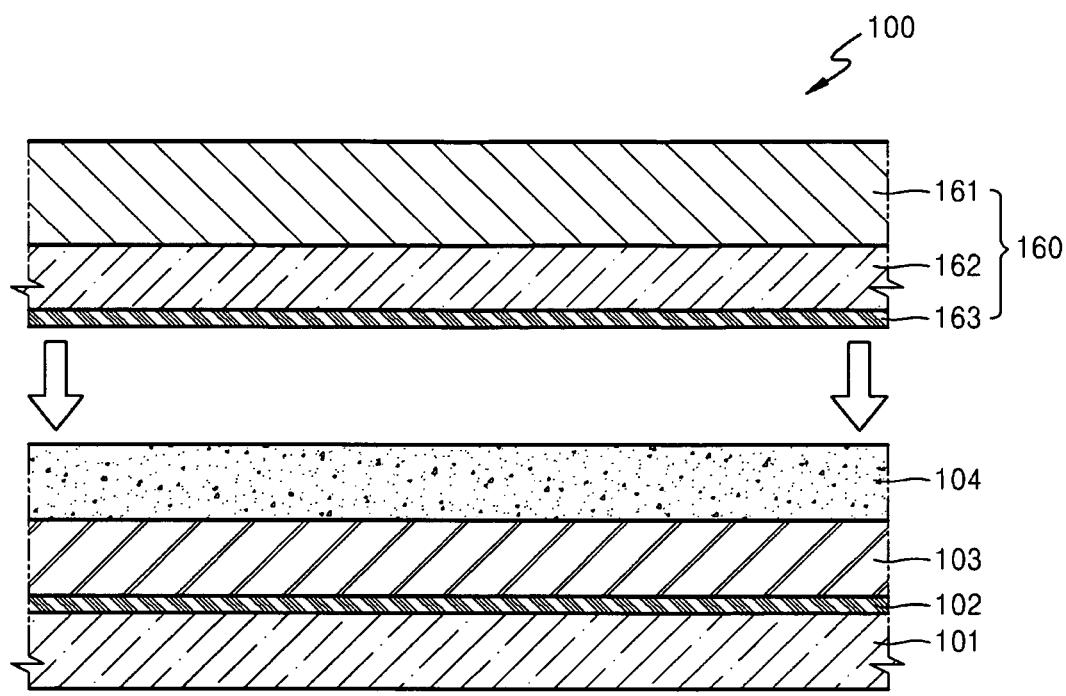
FIG. 1 is a cross-sectional view of a flexible display device before being assembled, according to an embodiment of the present invention.
Figure 2:
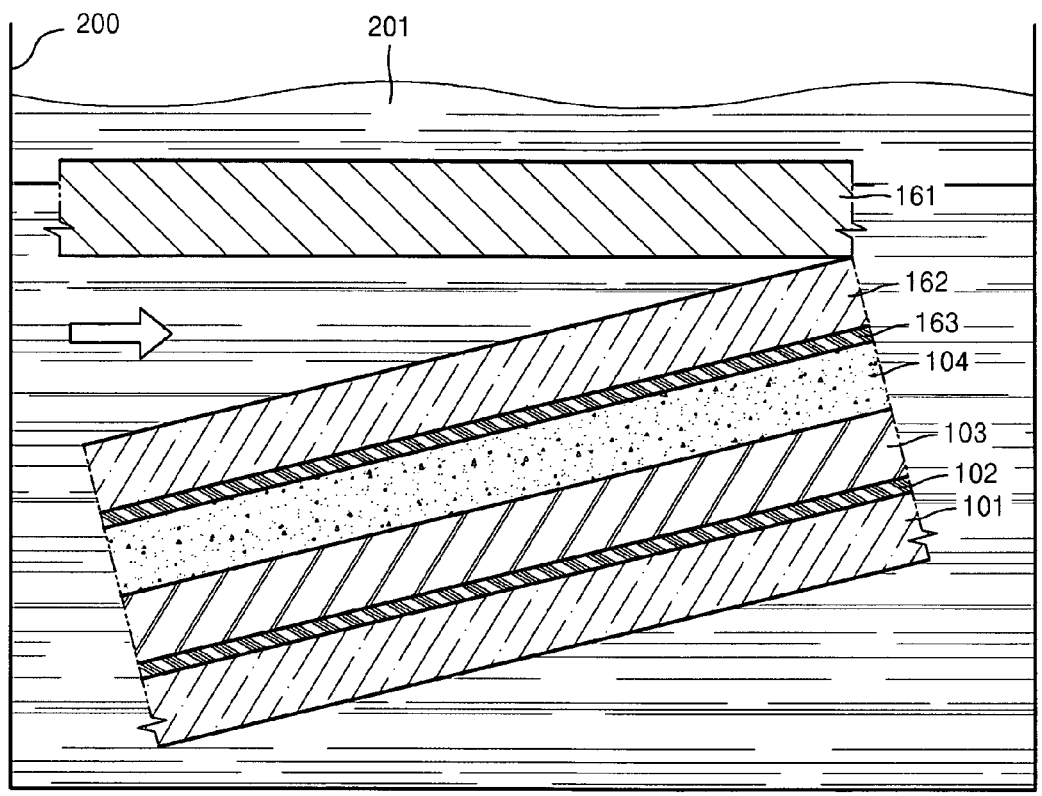
FIG. 2 is a cross-sectional view of the flexible display device of FIG. 1, wherein a base substrate is separated from a flexible substrate.

FIG. 1 is a cross-sectional view of a flexible display device 100 before being assembled, according to an embodiment of the present invention, and FIG. 2 is a cross-sectional view of the flexible display device 100 of FIG. 1, wherein a base substrate 161 is separated from a second flexible substrate 162.

Referring to FIGS. 1 and 2, a first barrier layer 102 is formed on a first flexible substrate 101. The first flexible substrate 101 may be formed of a flexible material that can bend, for example, a polymer material such as a plastic film. The first barrier layer 102 blocks oxygen and moisture. A thin film transistor (TFT) 103 is formed on the first barrier layer 102. An organic light emitting diode (OLED) 104, as a display unit, is formed on the TFT 103.

An encapsulation unit 160 is prepared separately from forming the first barrier layer 102, the TFT 103, and the OLED 104 on the first flexible substrate 101.

The encapsulation unit 160 includes the base substrate 161. The base substrate 161 is a thick film substrate, such as glass. A thickness of the base substrate 161 is about 0.5 mm. The second flexible substrate 162 is formed on the base substrate 161. The second flexible substrate 162 may be formed of a polymer material such as a plastic film, like the first flexible substrate 101.

The second flexible substrate 162 is a thin film substrate that is thinner than the base substrate 161, and a thickness of the second flexible substrate 162 is from about 10 to about 100 μm. A second barrier layer 163 is formed on the second flexible substrate 162.

The second barrier layer 163 of the encapsulation unit 160 is arranged facing the OLED 104, and as indicated by arrows, the encapsulation unit 160 is coupled on the OLED 104.

After the coupling, the flexible display device 100 is dipped in a bath 200 storing a solution 201 heated to a predetermined temperature. The solution 201 may be water.

When the flexible display device 100 is dipped in the bath 200, the base substrate 161 and the second flexible substrate 162 are detached from each other because of a difference between a coefficient of thermal expansion (CTE) of the base substrate 161 that is a thick film substrate and a CTE of the second flexible substrate 162 that is a thin film substrate. Then, by repeating a process of penetrating the solution 201 through a detached space between the base substrate 161 and the second flexible substrate 162, the base substrate 161 may be separated from the second flexible substrate 162.

Figure 12:
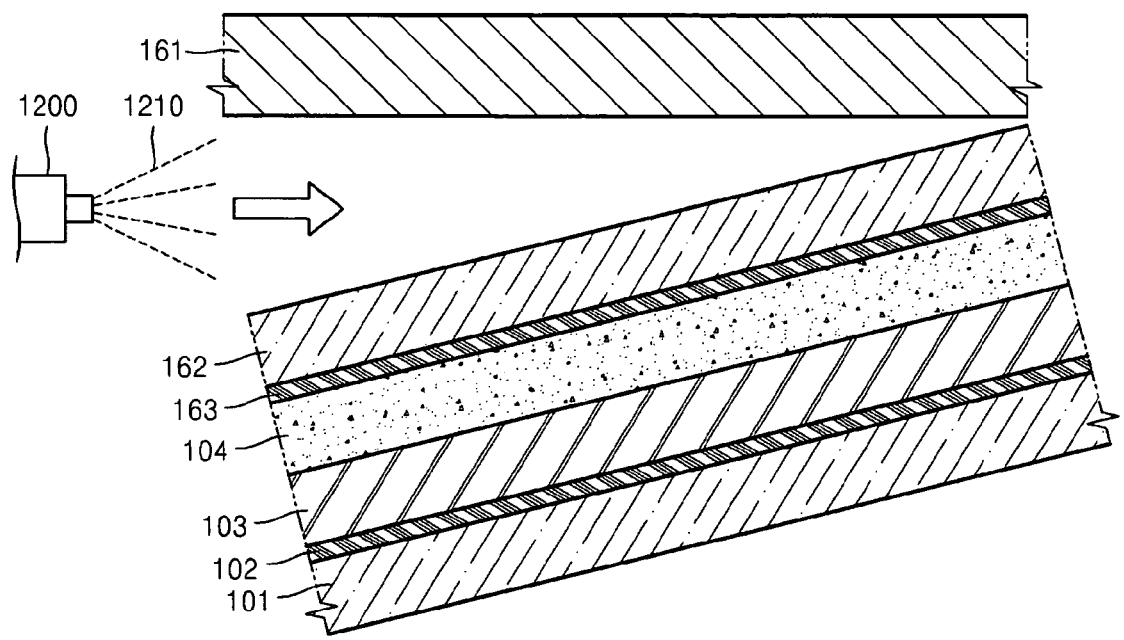
FIG. 12 is a cross-sectional view of a modified example of the flexible display device of FIG. 1, wherein the base substrate is separated from the flexible substrate.

Alternatively, as shown in FIG. 12, the base substrate 161 may be separated from the second flexible substrate 162 by spraying a portion between the base substrate 161 and the second flexible substrate 162 with a solution 1210 by using a spraying unit, such as a nozzle 1200, instead of the bath 200 storing the solution 201 of FIG. 2.

A method of manufacturing a flexible display device 1100, according to an embodiment of the present invention, including separating a thick film type base substrate from a thin film type flexible substrate will now be described.

FIGS. 3 through 11 are cross-sectional views for sequentially describing the method of manufacturing the flexible display device 1100, according to an embodiment of the present invention.

Figure 3:
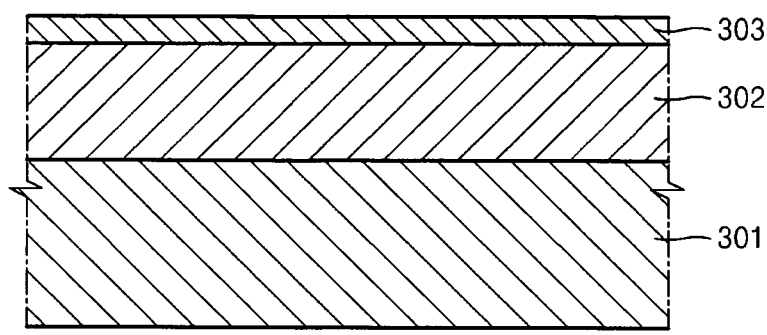

Referring to FIG. 3, a first base substrate 301 is prepared. A first flexible substrate 302 is formed on the first base substrate 301, and a first barrier layer 303 is formed on the first flexible substrate 302.

The first base substrate 301 may be a translucent substrate through which a laser beam passes. The first base substrate 301 may be formed of a material that has a desired mechanical strength and does not deform, for example, does not bend, even when various elements or thin film layers are formed on the first base substrate 301.

The first base substrate 301 of the current embodiment is a glass substrate formed of soda lime glass, but a material of the first base substrate 301 is not limited as long as the material has the above characteristics. A thickness of the first base substrate 301 is about 0.5 mm, and the first base substrate 301 is a thick film substrate.

The first flexible substrate 302 may be formed of a polymer material such as a plastic film, which has a smaller specific gravity than the first base substrate 301, is light, is hard to break, and is bendable. Although the first flexible substrate 302 is light and easily realized as a thin film display when the thickness of the first flexible substrate 302 is thin, the first flexible substrate 302 must be able to support weights of an element and a thin film layer formed on the first flexible substrate 302 even after the first base substrate 301 is separated from the first flexible substrate 302.

Accordingly, the first flexible substrate 302 is a thin film substrate having a thickness from about 10 to 100 μm. When the thickness of the first flexible substrate 302 is below or equal to 10 μm, it may be difficult to stably maintain shapes of a thin film layer and elements formed on the first flexible substrate 302 when the first base substrate 301 is separated from the first flexible substrate 302. When the thickness of the first flexible substrate 302 is equal to or above 100 μm, the first flexible substrate 302 may not be suitable for realizing the flexible display device 1100.

Here, the first flexible substrate 302 that is a thin film type may be formed of a material, such as a polymer material, having a CTE (ppm/° C.) different from the first base substrate 301 that is a thick film type. Examples of the polymer material include polycarbonate (PC), polyethersulphone (PES), polyethylene terephthalate (PET), polyethylenenaphthalate (PEN), polyimide (PI), polyarylate (PAR), and fiber glass reinforced plastic (FRP).

Since the CTEs of the first flexible substrate 302 and the first base substrate 301 are different from each other, the first flexible substrate 302 and the first base substrate 301 may be separated from each other by using the different CTEs.

The first barrier layer 303 is formed on the first flexible substrate 302. The first barrier layer 303 may be formed of an inorganic material, such as silicon oxide (SiOx), silicon nitride (SiNx), silicon oxynitride (SiON), aluminum oxide (AlO), or aluminum oxynitride (AlON), or an organic material, such as acryl or PI, or by alternatively stacking the organic material and the inorganic material. The first barrier layer 303 blocks oxygen and moisture, and at the same time, helps crystallization of a semiconductor by preventing diffusion of moisture or impurities in the first flexible substrate 302 or by adjusting a transfer speed of heat during crystallization.

Figure 4:
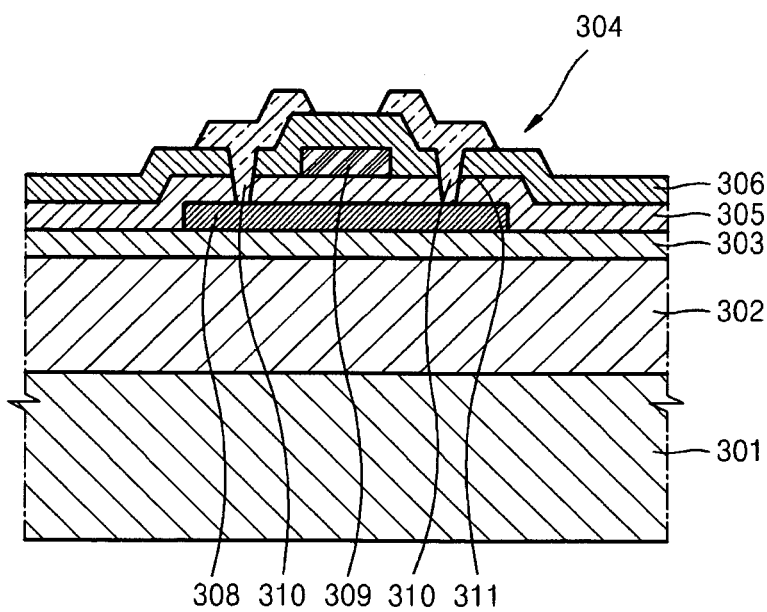

As shown in FIG. 4, a TFT 304 is formed on the first flexible substrate 302. The TFT 304 of the current embodiment is a top gate type, but a type of the TFT 304 is not limited thereto, and the TFT 304 may be a bottom gate type.

Figure 5:
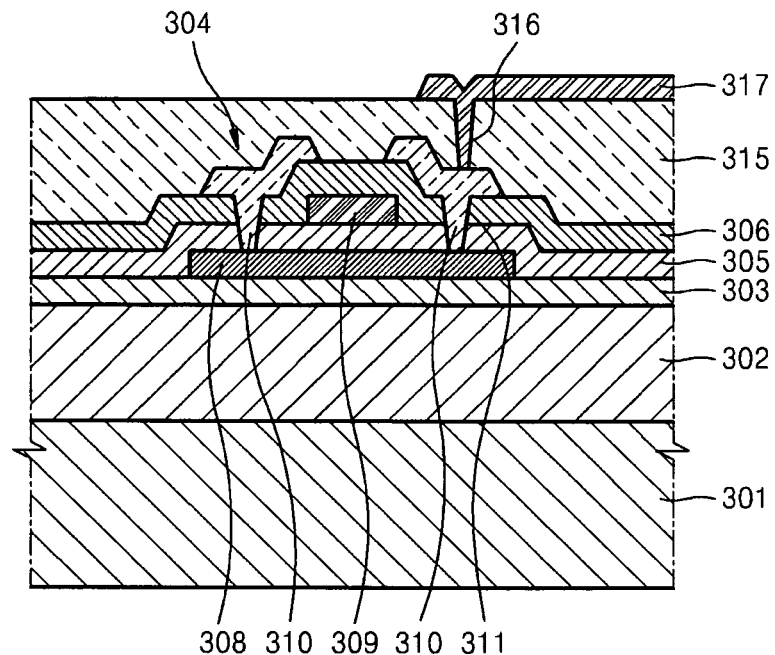

When the TFT 304 is the top gate type, a semiconductor layer, 308, a gate insulation layer 305, a gate electrode 309, an interlayer insulation layer 306, a contact hole 311, source and drain electrodes 310, and a protection layer 315 of FIG. 5 are sequentially formed on the first barrier layer 303.

The semiconductor layer 308 may be formed of polysilicon, and here, a predetermined region may be doped with impurities. Alternatively, the semiconductor layer 308 may be formed of amorphous silicon, and furthermore, may be formed of an organic semiconductor material, such as pentacene.

When the semiconductor layer 308 is formed of polysilicon, the polysilicon is formed by forming amorphous silicon and crystallizing the amorphous silicon. Examples of a method of crystallizing amorphous silicon include a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method, but a method that does not require a heating process at a high temperature may be applied to the first flexible substrate 302.

According to a conventional process of activating a semiconductor, a temperature of a substrate increases up to 400 to 500° C. as a high temperature process is continued, and thus a flexible substrate, such as a plastic film, is unable to be used. However recently, the semiconductor layer 308 is activated by irradiating a laser beam for a short period of time, during crystallization according to a low temperature poly-silicon (LTPS) process, and thus the first flexible substrate 302 is not exposed to a high temperature equal to or above 300° C. Thus, an entire process may be performed at a temperature below or equal to 300° C. Accordingly, the TFT 304 may be formed by using the first flexible substrate 302 formed of the plastic film, in the current embodiment.

The gate insulation layer 305 is formed between the semiconductor layer 308 and the gate electrode 309 so as to insulate the semiconductor 308 and the gate electrode 309 from each other. The gate insulation layer 305 may be formed of an insulating material, such as silicon oxide or silicon nitride, but a material of the gate insulation layer 305 is not limited thereto.

The gate electrode 309 may be formed of any conductive material. For example, the gate electrode 309 may be formed of molybdenum (Mo), tungsten (W), MoW, or gold (Au). In this regard, the gate electrode 309 may have various structures such as a single-layered structure and a multi-layered structure.

The interlayer insulation layer 306 may be formed of an insulating material such as silicon oxide and silicon nitride. The interlayer insulation layer 306 may also be formed of other insulating organic materials. The contact hole 311 for exposing source and drain regions therethrough may be formed by selectively removing the interlayer insulation layer 306 and the gate insulation layer 305. The source and drain electrodes 310 having a single-layered structure or a multi-layered structure may be disposed on the interlayer insulation layer 306 so as to fill the contact hole 311.

The protection layer 315 (passivation layer and/or planarization layer (FIG. 5)) is formed on the source and drain electrodes 310 to protect and planarize the TFT 304 disposed under the protection layer 315. The protection layer 315 may be configured to have various shapes, and may be formed of an organic material such as benzocyclobutene (BCB) or acryl, or an inorganic material such as SiNx. The protection layer 315 may have various structures such as a single-layered structure or a multi-layered structure.

Then, a display device is formed on the TFT 304. Even though an OLED 319 of FIG. 7 is used herein as the display device, the present invention is not limited thereto, and various display devices may also be used.

Figure 7:
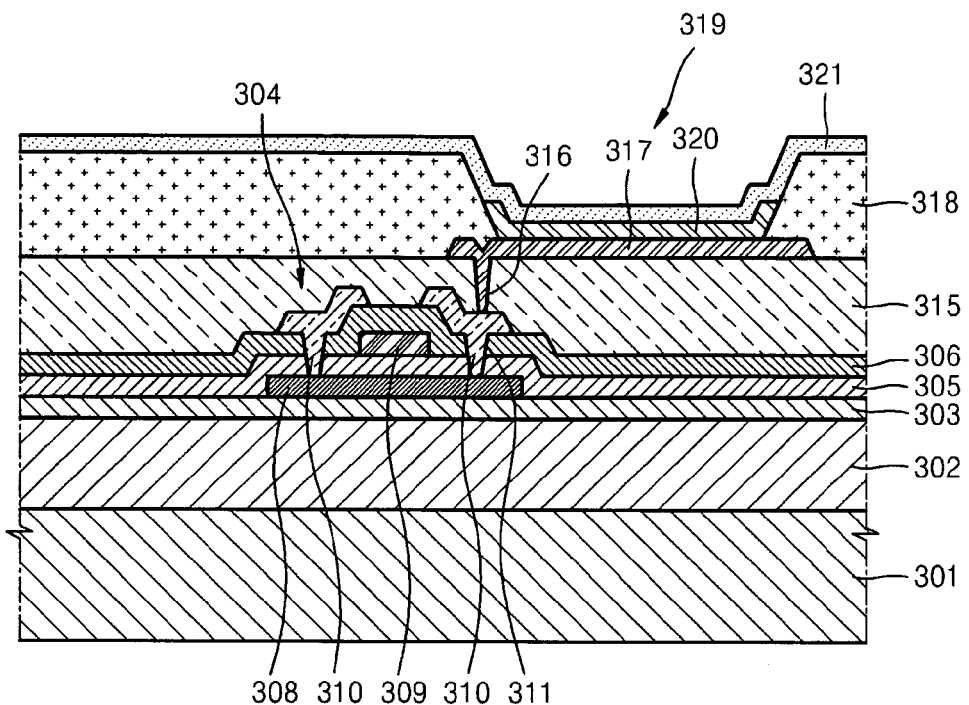

Referring to FIG. 5, one of the source and drain electrodes 310 may be electrically connected to a first electrode 317 via a contact hole 316, so as to form the OLED 319 of FIG. 7 on the TFT 304.

The first electrode 317 may function as one of the electrodes of the OLED 319 and may be formed of various conductive materials. The first electrode 317 may be a transparent electrode or a reflective electrode according to the OLED 319 to be formed. If a transparent electrode is used, the first electrode 317 may be formed of ITO, IZO, ZnO, or $In_2O_3$. Otherwise, if a reflective electrode is used, the first electrode 317 may be formed by forming a reflective layer using silver (Ag), magnesium (Mg), aluminum (Al), platinum (Pt), lead (Pd), gold (Au), nickel (Ni), neodymium (Nd), iridium (Ir), chromium (Cr), or any compound thereof, and doping the reflective layer with ITO, IZO, ZnO, or $In_2O_3$.

Figure 6:
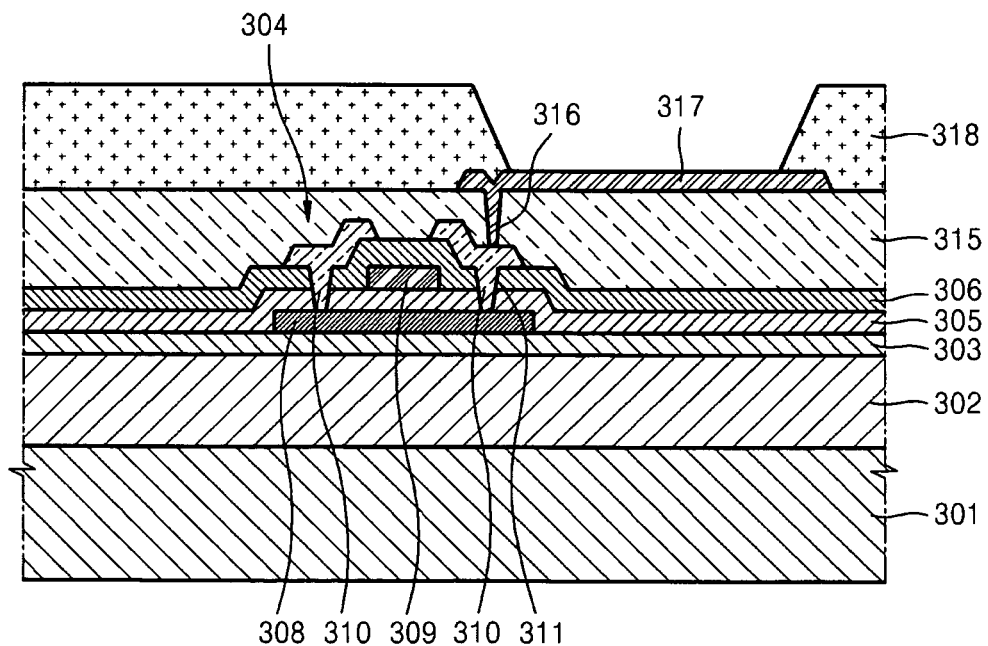

Then, as shown in FIG. 6, a pixel definition layer 318 is formed on the first electrode 317 by patterning an insulating material such that at least one portion of the first electrode 317 is exposed.

Then, as shown in FIG. 7, the OLED 319 may be prepared by forming an intermediate layer 320 that includes an emission layer on the exposed region of the first electrode 317, and forming a second electrode 321 that faces the first electrode 317 such that the first electrode 317 and the second electrode 321 are formed on both sides of the intermediate layer 320.

Even though the intermediate layer 320 shown in FIG. 7 is disposed to correspond to each sub-pixel, i.e., only to the patterned first electrode 317, FIG. 7 is presented to conveniently describe the constitution of the sub-pixels. The intermediate layer 320 may also be integrally formed with the intermediate layer 320 of an adjacent sub-pixel. Alternatively, some layers of the intermediate layer 320 may be formed to correspond to each sub-pixel, and the other layers of the intermediate layer 320 may be integrally formed with an intermediate layer 320 of an adjacent sub-pixel.

The intermediate layer 320 may be formed of a low molecular or high molecular weight organic material.

If the intermediate layer 320 is formed of a low molecular weight organic material, a hole injection layer (HIL), a hole transport layer (HTL), an emission layer (EML), an electron transport layer (ETL), an electron injection layer (EIL), etc., may be stacked in a single or complex structure to form the intermediate layer 320.

The low molecular weight organic material may be copper phthalocyanine (CuPc), N,N'-Di(naphthalene-1-yl)-N,N'-diphenyl-benzidine (NPB), tris-8-hydroxyquinoline aluminum (Alq3), or the like. The intermediate layer 320 may be formed by vacuum depositing the low molecular weight organic material using masks.

If the intermediate layer 320 is formed of a high molecular weight organic material, the intermediate layer 320 may include a HTL and an EML. Here, the HTL may be formed of PEDOT, and the EML may be formed of a high molecular weight organic material such as poly-phenylenevinylene (PPV), polyfluorene, or the like. The intermediate layer 320 may be formed using a screen printing method, an ink-jet printing method, or the like.

The second electrode 321 may also be a transparent or reflective electrode, similar to the first electrode 317. If a transparent electrode is used, the second electrode 321 may be formed by forming a layer including Li, Ca, LiF/Ca, LiF/Al, Al, Mg, or any combinations thereof, and then forming an auxiliary electrode or bus electrode line by using a conductive material such as ITO, IZO, ZnO, or $In_2O_3$. Otherwise, if a reflective electrode is used, the second electrode 321 may be formed by depositing Li, Ca, LiF/Ca, LiF/Al, Al, Ag, Mg, or combinations thereof on the whole surface of the intermediate layer 320 and pixel definition layer 318.

Figure 8:
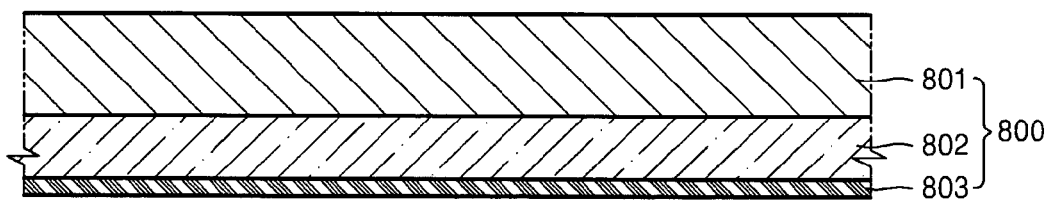

Next, an encapsulation unit 800 is separately prepared as shown in FIG. 8.

The encapsulation unit 800 includes a second base substrate 801, a second flexible substrate 802 formed on the second base substrate 801, and a second barrier layer 803 formed on the second flexible substrate 802.

The second base substrate 801 is formed of glass like the first base substrate 301, but a material of the second base substrate 801 is not limited thereto. The second base substrate 801 is a thick film substrate that has a predetermined strength level and is hard to break. A thickness of the second base substrate 801 is about 0.5 mm.

The second flexible substrate 802 may be formed of a polymer material such as a plastic film, like the first flexible substrate 302. The second flexible substrate 802 is a thin film substrate that freely bends. A thickness of the second flexible substrate 802 may be from about 10 to 100 μm. The second flexible substrate 802 may be formed by coating a polymer solution on the second base substrate 801.

Here, CTEs of the second base substrate 801 and the second flexible substrate 802 are different from each other. The CTE of the thin film type second flexible substrate 802 is higher than the CTE of the thick film type second base substrate 801.

For example, a CTE of glass used to form the second base substrate 801 is 8 ppm/° C., whereas a CTE of a polymer material used to form the second flexible substrate 802 is, for example, 90 ppm/° C. in PC, 60 ppm/° C. in PES, 30 ppm/° C. in PET, 20 ppm/° C. in PEN, 50 ppm/° C. in PI, 53 ppm/° C. in PAR, and 14 ppm/° C. in FRP. As such, the second flexible substrate 802 has about twice as much CTE as the second base substrate 801, but materials of the second base substrate 801 and the second flexible substrate 802 are not limited as long as their CTEs are different.

When the second flexible substrate 802 is included in the encapsulation unit 800, a water vapor transmission rate (WVTR) of the second flexible substrate 802 is from 10 to 1000 g/m$^2$/day and an oxygen transmission rate (OTR) of the second flexible substrate 802 is from 4 to 5 cc/m$^2$/day since the second flexible substrate 802 is formed of a polymer material such as a plastic film. Thus, the WVTR and the OTR of the second flexible substrate 802 are not suitable for ensuring a long lifespan of the OLED 319, which requires WVRT below or equal to $10^{-6}$ g/m$^2$/day, and OTR between $1\times10^{-3}$ and $1\times10^{-5}$ cc/m$^2$/day. Accordingly, the second barrier layer 803 is formed on the second flexible substrate 802.

The second barrier layer 803 may be formed of an inorganic material such as SiOx, SiNx, SiON, AlO, or AlON, or an organic material such as acryl or polyimide. Alternatively, the second barrier layer 803 may be formed by alternatively stacking the organic material and the inorganic material. The second barrier layer 803 blocks oxygen and moisture, and at the same time, helps crystallization of a semiconductor by preventing diffusion of moisture or impurities in the second flexible substrate 802 or by adjusting a transfer speed of heat during crystallization.

Here, the second barrier layer 803 may be formed via a high temperature deposition process performed at a temperature from about 80 to 400° C. As such, by separately preparing the encapsulation unit 800 and combining the encapsulation unit 800 with the OLED 319, the encapsulation unit 800 may include the second barrier layer 803 that is formed at the high temperature deposition process. The OLED 319 is more stably protected since the encapsulation unit 800 includes the second barrier layer 803.

Figure 9:
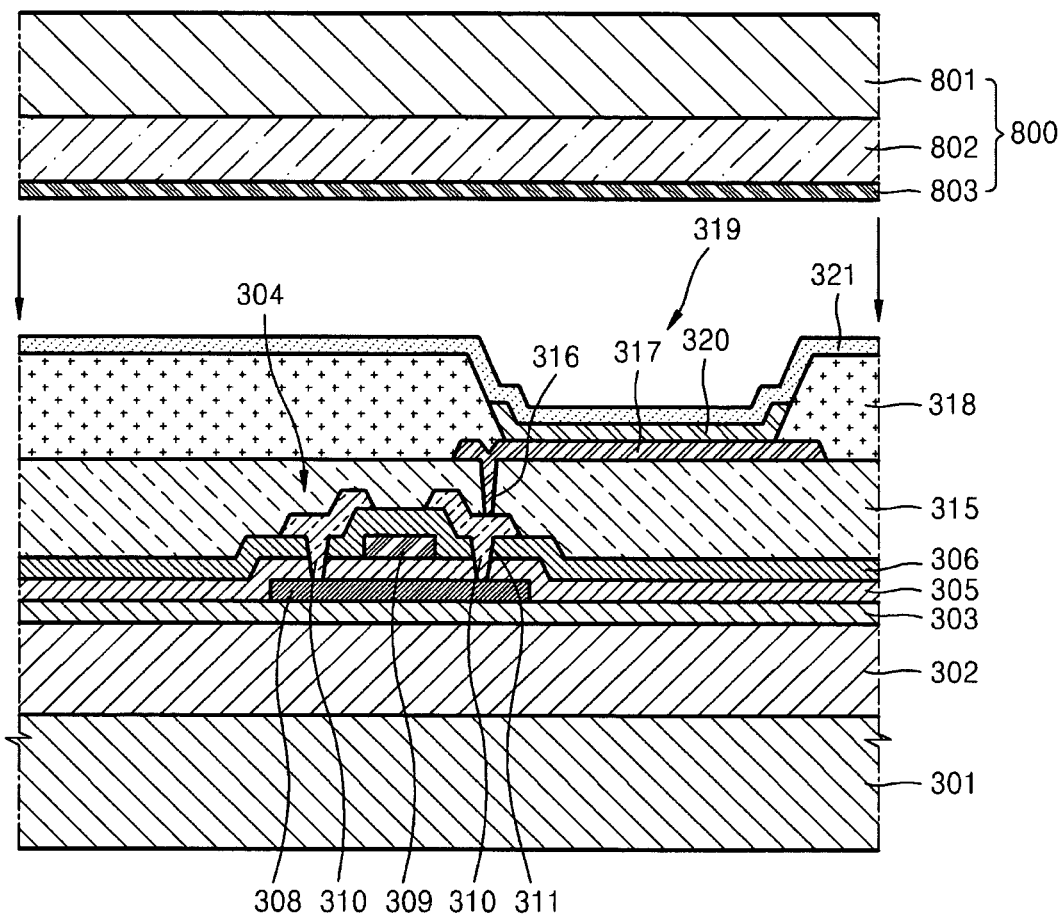

Then, as shown in FIG. 9, the second barrier layer 803 and the OLED 319 are disposed to face each other, and the encapsulation unit 800 is coupled to the OLED 319. A laser beam may be used to couple the OLED 319 and the encapsulation unit 800. Alternatively, a predetermined adhesive material may be added to the second barrier layer 803, the encapsulation unit 800 may be disposed on the OLED 319, and then the encapsulation unit 800 may be compressed onto the OLED 319, thereby combining the encapsulation unit 800 with the OLED 319.

Figure 10:
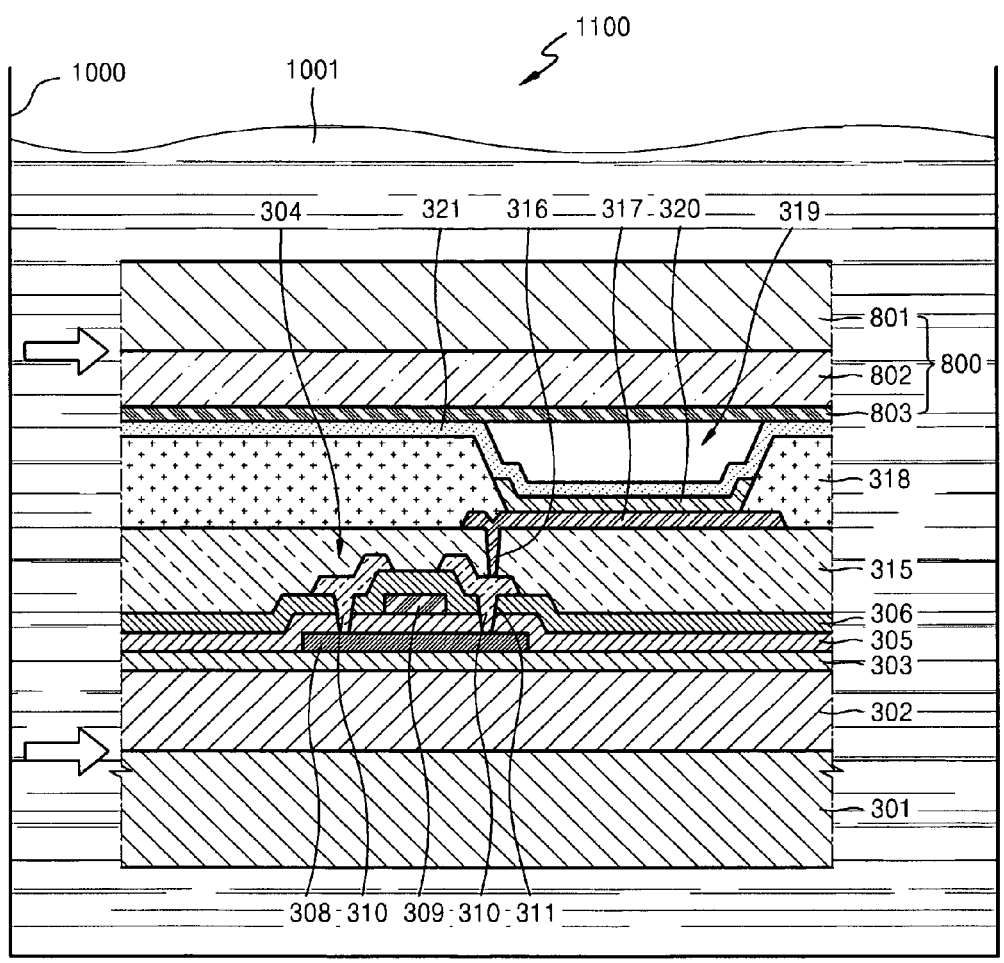

Next, as shown in FIG. 10, the coupled flexible display device 1100 is dipped in a bath 1000 storing a solution 1001 heated up to a predetermined temperature, so as to separate the first base substrate 301 from the first flexible substrate 302 and the second base substrate 801 from the second flexible substrate 802.

In the current embodiment, water is used as the solution 1001. Water is used since water is eco-friendly as it does not generate pollution source, is stable compared to other solutions even when heated, and has low production costs. However, another solution, such as isopropyl alcohol (IPA), may be used as the solution 1001, instead of water.

Here, since adhesion between the first base substrate 301 and the first flexible substrate 302, and adhesion between the second base substrate 801 and the second flexible substrate 802 are already stable when the solution 1001 is at room temperature, the temperature of the solution 1001 may be higher than room temperature. When the solution 1001 is water, the temperature of the solution 1001 may be equal to or above about 50° C. for separation. However, a temperature range of the heated solution 1001 may differ based on a boiling point, a glass transition temperature (Tg), or the like.

When the flexible display device 1100 is dipped in the bath 1000 storing the heated solution 1001, the adhesions between the first base substrate 301 and the first flexible substrate 302, and between the second base substrate 801 and the second flexible substrate 802 are weakened, and thus the first base substrate 301 starts to detach from the first flexible substrate 302, and the second base substrate 801 starts to detach from the second flexible substrate 802.

Then, as indicated by arrows, by repeating a process of penetrating the solution 1001 through detached spaces, the first base substrate 301 may be separated from the first flexible substrate 302, and the second base substrate 801 may be separated from the second flexible substrate 802.

Figure 13:
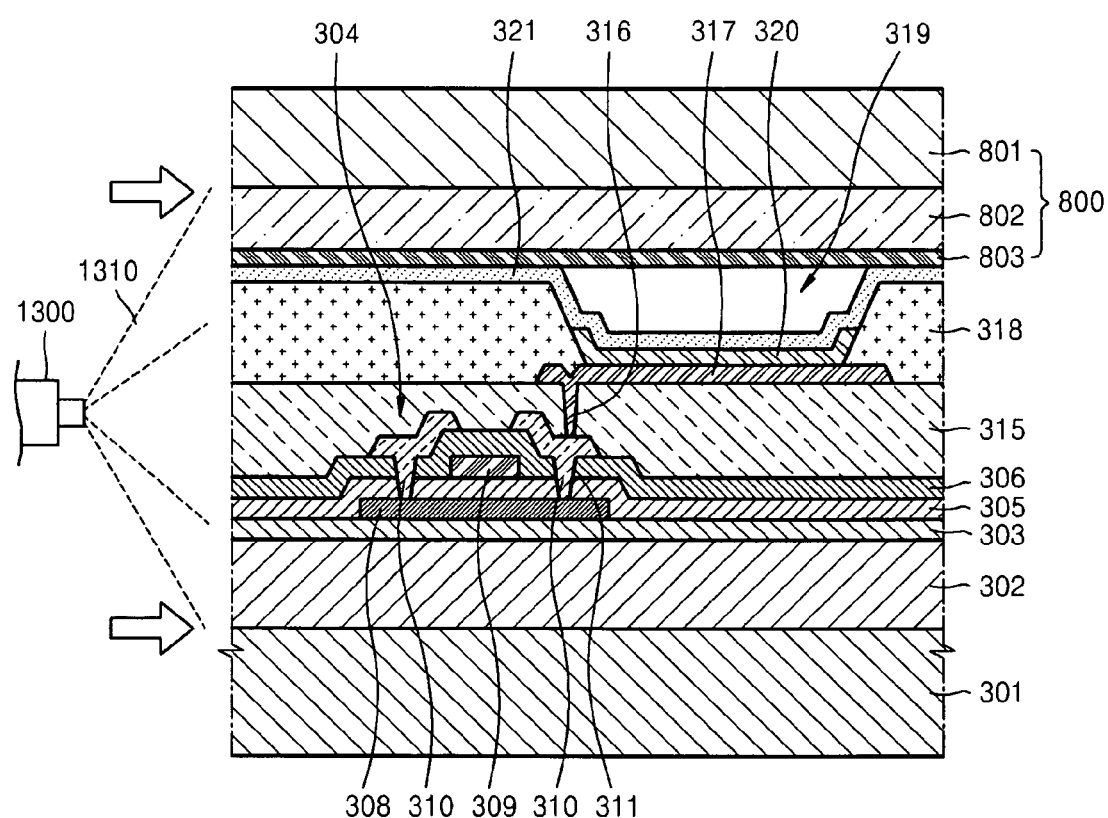
FIG. 13 is a cross-sectional view of a modified example of the flexible display device after the first base substrate and the second base substrate are separated from the flexible display device.

Alternatively, as shown in FIG. 13, the first base substrate 301 may be separated from the first flexible substrate 302, and the second base substrate 801 may be separated from the second flexible substrate 802 by spraying a portion between the first base substrate 301 and the first flexible substrate 302 with a solution 1310, and a portion between the second base substrate 801 and the second flexible substrate 802 with a solution 1310, by using a spray unit, such as a nozzle 1300, instead of the bath 1000 storing the heated solution 1001 shown in FIG. 10

Figure 11:
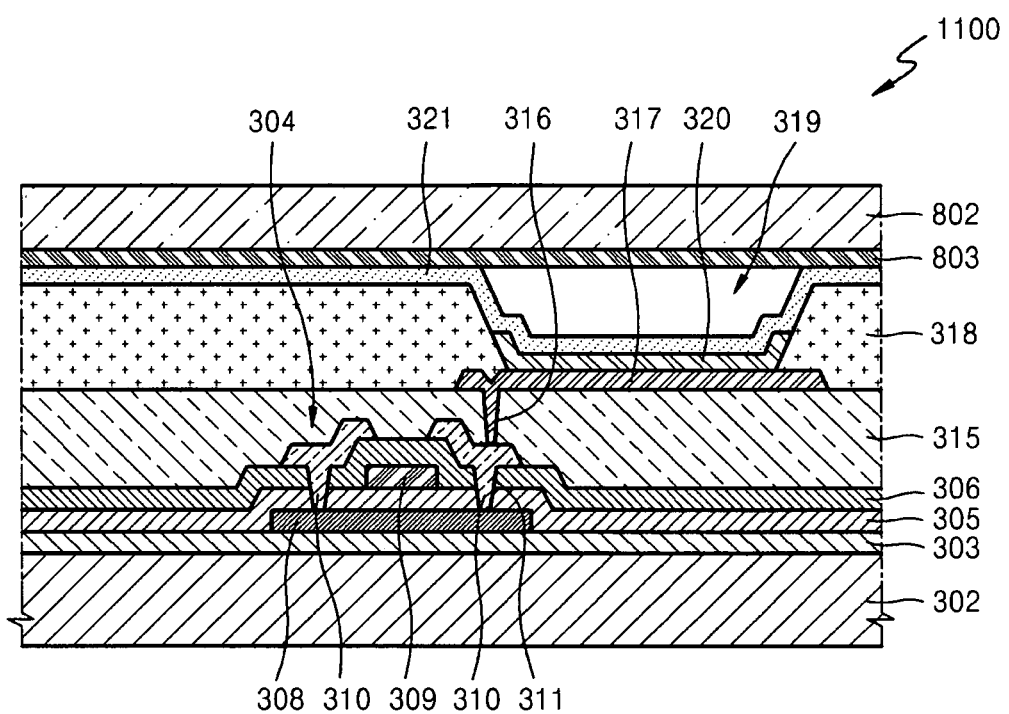

By separating the first base substrate 301 and the second base substrate 801 as above, the flexible display device 1100, wherein the TFT 304 and the OLED 319 are disposed on the first flexible substrate 302, is obtained as shown in FIG. 11.

As described above, the method of manufacturing the flexible display device, according to the present invention has the following effects.

First, processes are convenient since a base substrate and a flexible substrate, which have different CTEs and are coupled together, may be separated by using a heated solution.

Second, water is used as the heated solution, and thus expenses are reduced and stability is improved, thereby reducing production costs and increasing productivity.

Third, the method is eco-friendly as a pollution source is not generated.

Fourth, since an encapsulation process is not performed directly on an OLED, riskiness of deterioration of OLED due to plasma while depositing an inorganic layer may be reduced.

Fifth, it is possible to form an inorganic layer on a flexible substrate, which is durable at a high temperature.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a flexible display device, the method comprising:
   preparing a first flexible substrate on which a display unit is formed;
   forming an encapsulation unit comprising a base substrate, a second flexible substrate formed on the base substrate, and a barrier layer formed on the second flexible substrate;
   combining the encapsulation unit with the display unit; and
   separating the base substrate from the second flexible substrate by using a difference between a coefficient of thermal expansion of the base substrate and a coefficient of thermal expansion of the second flexible substrate, by applying a heated solution between the base substrate and the second flexible substrate.

2. The method of claim 1, wherein, in the forming of the encapsulation unit, the base substrate is a film substrate having a first coefficient of thermal expansion, and the second flexible substrate is a flexible film substrate having a second coefficient of thermal expansion higher than the first coefficient of thermal expansion, the second flexible substrate being thinner than the base substrate.

3. The method of claim 2, wherein the base substrate comprises glass.

4. The method of claim 2, wherein the second flexible substrate comprises any one of polycarbonate (PC), polyethersulphone (PES), polyethylene terephthalate (PET), polyethylenenaphthalate (PEN), polyimide (PI), polyarylate (PAR), and fiber glass reinforced plastic (FRP).

5. The method of claim 2, wherein the second flexible substrate is formed by coating a polymer material for forming the second flexible substrate on the base substrate.

6. The method of claim 1, wherein, in the separating of the base substrate from the second flexible substrate, the solution comprises water having a temperature higher than room temperature.

7. The method of claim 1, wherein the base substrate is separated from the second flexible substrate by dipping the combined first flexible substrate and encapsulation unit in the heated solution.

8. The method of claim 1, wherein the base substrate is separated from the second flexible substrate by spraying a portion between the base substrate and the second flexible substrate with the heated solution.

9. A method of manufacturing a flexible display device, the method comprising:
   forming a first barrier layer on a first flexible substrate;
   forming a thin film transistor on the first barrier layer;
   forming a display unit electrically connected to the thin film transistor, on the thin film transistor;
   forming an encapsulation unit comprising a base substrate, a second flexible substrate formed on the base substrate, and a second barrier layer formed on the second flexible substrate;
   combining the encapsulation unit with the display unit; and
   separating the base substrate from the second flexible substrate by using a difference between a coefficient of thermal expansion of the base substrate and a coefficient of thermal expansion of the second flexible substrate, by applying a heated solution between the base substrate and the second flexible substrate.

10. The method of claim 9, wherein, in the forming of the encapsulation unit, the encapsulation layer is manufactured separately from the display unit, and combined to the display unit.

11. The method of claim 9, wherein the base substrate is a film substrate having a first coefficient of thermal expansion, and the second flexible substrate is a flexible film substrate having a second coefficient of thermal expansion higher than the first coefficient of thermal expansion, the second flexible substrate being thinner than the base substrate.

12. The method of claim 11, wherein the base substrate comprises glass.

13. The method of claim 11, wherein the second flexible substrate comprises any one of polycarbonate (PC), polyethersulphone (PES), polyethylene terephthalate (PET), polyethylenenaphthalate (PEN), polyimide (PI), polyarylate (PAR), and fiber glass reinforced plastic (FRP).

14. The method of claim 9, wherein the second flexible substrate is formed by coating a polymer material for forming the second flexible substrate on the base substrate.

15. The method of claim 9, wherein, in the separating of the base substrate from the second flexible substrate, the solution comprises water having a temperature higher than room temperature.

16. The method of claim 9, wherein the base substrate is separated from the second flexible substrate by dipping the combined first flexible substrate and encapsulation unit in the heated solution or spraying a portion between the base substrate and the second flexible substrate with the heated solution.

17. The method of claim 9, further comprising forming an additional base substrate for supporting the first flexible substrate, below the first flexible substrate.

18. The method of claim 17, wherein the additional base substrate is formed of the same material as the base substrate of the encapsulation unit, and the first flexible substrate is formed of the same material as the second flexible substrate.

19. The method of claim 17, wherein the additional base substrate is separated from the first flexible substrate by dipping the additional base substrate in the heated solution or spraying a portion between the additional base substrate and the first flexible substrate with the heated solution.

20. The method of claim 17, wherein the first and second barrier layers are an organic layer or an inorganic layer, or have a multi-layer structure, wherein an organic layer and an inorganic layer are alternately stacked.

* * * * *